United States Patent
Domurat-Linde et al.

(10) Patent No.: US 9,742,312 B2
(45) Date of Patent: Aug. 22, 2017

(54) APPARATUS AND ELECTRICAL ASSEMBLY FOR CONVERTING A DIRECT VOLTAGE INTO AN ALTERNATING VOLTAGE

(71) Applicants: AUDI AG, Ingolstadt (DE); VOLKSWAGEN AG, Wolfsburg (DE)

(72) Inventors: Andre Domurat-Linde, Berlin (DE); Eckart Hoene, Berlin (DE); Tobias Enzinger, Hohenwart (DE); Thomas Rinkleff, Wolfsburg (DE)

(73) Assignees: Audi AG, Ingolstadt (DE); Volkswagen AG, Wolfsburg (DE)

( * ) Notice: Subject to any disclaimer, the term of this patent is extended or adjusted under 35 U.S.C. 154(b) by 0 days.

(21) Appl. No.: 14/889,487

(22) PCT Filed: May 5, 2014

(86) PCT No.: PCT/EP2014/059095
§ 371 (c)(1),
(2) Date: Nov. 6, 2015

(87) PCT Pub. No.: WO2014/184030
PCT Pub. Date: Nov. 20, 2014

(65) Prior Publication Data
US 2016/0094150 A1    Mar. 31, 2016

(30) Foreign Application Priority Data
May 14, 2013   (DE) .................... 10 2013 008 193

(51) Int. Cl.
*H02M 7/537*    (2006.01)
*H02P 27/00*    (2006.01)
(Continued)

(52) U.S. Cl.
CPC .......... *H02M 7/537* (2013.01); *H01L 25/072* (2013.01); *H02P 27/00* (2013.01); *H05K 7/1432* (2013.01);
(Continued)

(58) Field of Classification Search
CPC .......... H02M 1/00; H02M 7/537; H05K 7/14; H01L 25/07; H02P 27/00
See application file for complete search history.

(56) References Cited

U.S. PATENT DOCUMENTS 6,472,613 B1   10/2002   Reichard
6,563,198 B1    5/2003   Caldwell
(Continued)

FOREIGN PATENT DOCUMENTS

CN     101088160 A     12/2007
DE         4429925     11/1995
(Continued)

OTHER PUBLICATIONS

David L. Jones, PCB Design Tutorial, Jun. 29, 2004, pp. 1-25, www.alternatezone.com.

*Primary Examiner* — Eduardo Colon Santana
*Assistant Examiner* — Said Bouziane
(74) *Attorney, Agent, or Firm* — 2SPL Patentanwaelte PartG mbB; Mani Arabi

(57) ABSTRACT

Embodiments relate to an electrical assembly (1) for converting a direct voltage into an alternating voltage, comprising a first supply voltage area (10) for distributing a first DC supply voltage, and a second supply voltage area (12) for distributing a second DC supply voltage. The electrical assembly (1) comprises at least one first power semiconductor (24) having an input terminal connected to the first supply voltage area (12) and an output terminal (28) connected to an alternating voltage output (20*a*) of the assem-
(Continued)

bly. The electrical assembly (1) further comprises at least one second power semiconductor (26) having an input terminal (32) connected to the second supply voltage area (12) and an output terminal connected to the alternating voltage output (20*a*) of the assembly, wherein the first supply voltage area (10) extends on the side of the first power semiconductor (24) facing the input voltage terminal of the first power semiconductor (24). Furthermore the second supply voltage area (12) extends on the side of the second power semiconductor (26) facing away from the input voltage terminal (32) of the second power semiconductor (26).

13 Claims, 4 Drawing Sheets

(51) Int. Cl.
*H01L 25/07* (2006.01)
*H05K 7/14* (2006.01)
*H01L 23/52* (2006.01)

(52) U.S. Cl.
CPC .............. *H01L 2224/48091* (2013.01); *H01L 2224/48137* (2013.01); *H01L 2224/48472* (2013.01); *H01L 2924/1305* (2013.01); *H01L 2924/13055* (2013.01); *H01L 2924/19107* (2013.01)

(56) References Cited

U.S. PATENT DOCUMENTS

| | | | |
|---|---|---|---|
| 6,933,593 B2* | 8/2005 | Fissore | H01L 23/49861 257/666 |
| 2004/0113268 A1* | 6/2004 | Shirakawa | H01L 23/5383 257/724 |
| 2004/0227231 A1 | 11/2004 | Maly | |
| 2005/0035434 A1* | 2/2005 | Fissore | H01L 23/49861 257/666 |
| 2006/0152085 A1* | 7/2006 | Flett | B60L 9/30 307/75 |
| 2006/0202296 A1* | 9/2006 | Yano | H01L 31/0203 257/433 |
| 2013/0141871 A1* | 6/2013 | Omae | B62D 5/0406 361/709 |

FOREIGN PATENT DOCUMENTS

| | | |
|---|---|---|
| DE | 10101086 | 7/2001 |
| DE | 10101086 A1 | 7/2001 |
| DE | 10100620 | 12/2001 |
| EP | 1657750 | 1/1928 |
| EP | 0193133 | 9/1986 |
| EP | 137669 | 1/2004 |
| EP | 1376696 A1 | 1/2004 |
| JP | 2002-112530 | 4/2002 |
| JP | WO2013/018811 A1 | 2/2013 |
| WO | 2013/018811 A1 | 2/2013 |

\* cited by examiner

APPARATUS AND ELECTRICAL ASSEMBLY FOR CONVERTING A DIRECT VOLTAGE INTO AN ALTERNATING VOLTAGE

Embodiments of the present invention relate to electrical assemblies, in particular those by which a direct voltage may be converted into an alternating voltage.

There are numerous applications in which such assemblies, also referred to as inverters, are used. For example, inverters are used in the camping sector amongst others in order to generate from the direct voltage of the on-board network of a motor vehicle or a caravan, e.g. from a 12V supply voltage, a single-phase alternating voltage as it is commonly used in the alternating voltage networks with an effective voltage of 220V to be able to operate conventional devices in a mobile environment as well.

To generate the alternating voltage, a negative constant supply voltage and a positive constant supply voltage of two electric switches and/or power semiconductors with a high frequency are switched to an alternating voltage output in order to generate the positive and/or negative half-waves of the AC output voltage. Such inverters are available in both single-phase implementations and two-phase or three-phase implementations. The individual power semiconductors used as switches are typically mounted as an electrical assembly within a single module, i.e., on a common board and/or a printed circuit board (PCB), often with additional components which complement the functionality, such as free-wheeling diodes connected in parallel to the power semiconductors.

An important more recent application for such electrical assemblies by which it is possible to generate single-phase or multiphase alternating voltages from a direct voltage are electrified motor vehicles in which these assemblies are used in order to generate the alternating voltages required for the controlled operation of an electric motor to drive the vehicle. In doing so, high electric powers are usually implemented so that the power semiconductors, e.g. Insulated Gate Bipolar Transistors (IGBTs), used to switch the supply voltages to the relevant alternating voltage outputs of the modules and/or electrical assemblies have to be cooled. This prevents the same from being destroyed due to inherent power losses in the individual components themselves. Thereby, for generating each phase, the modules and/or the electrical assemblies for voltage conversion usually each use a pair of power semiconductors and/or semiconductor switches of the same type which are operated at a high switching speed in order to generate the alternating voltage of the relevant phase. Due to the high switching speeds and the partly substantial switched powers, these electrical assemblies may cause significant interferences in the on-board network of the vehicle. Such dynamic interferences may comprise frequencies up to several 100 MHz and thus, besides the functions necessary to operate the vehicle, also interfere with, e.g., the radio reception, the reception of televisions, the digital radio reception and other comfort functions in the vehicle. Furthermore, there is the danger that safety-relevant systems, such as data bus systems, in the vehicle may be interfered with by spreading high-frequency interferences.

Therefore, there is a demand for providing electrical assemblies for converting a direct voltage into an alternating voltage which cause less interferences in the networks surrounding them and/or the supply voltage networks.

Some embodiments of the invention facilitate this by using an electrical assembly for converting a direct voltage into an alternating voltage which comprises a first supply voltage area for distributing a first DC supply voltage and a second supply voltage area for distributing a second DC supply voltage, and at least one first power semiconductor having an input terminal connected to the first supply voltage area and an output terminal connected to an alternating voltage output of the assembly, and a second power semiconductor having an input terminal connected to the second supply voltage area and an output terminal connected to the alternating voltage output of the circuit. To increase the electromagnetic compatibility (EMC), and/or to reduce the emission of interferences, the second supply voltage area extends on the side of the second power semiconductor facing away from the input terminal of the same as well as the first supply voltage area extends on the side of the first power semiconductor facing the input voltage terminal of the first power semiconductor. Even if it might be sufficient, for electrically contacting at least the second power semiconductor, to only guide the second supply voltage area, which is associated with it, up to the second power semiconductor, if its input voltage terminal is located on the side of the power semiconductor facing away from the supply voltage area, the electrical assembly is set up such that the second supply voltage area also extends on the side of the second power semiconductor facing away from the input voltage terminal and thus extends below the same. This may result in the second supply voltage area also extending between the output terminal of the second power semiconductor and further metallic areas of the electrical assembly, such as cooling plates or the like, which may thus have a shielding effect with regard to further metallic objects. This may be particularly an advantage if the output terminal is located on the side of the power semiconductor facing the further components to be shielded as then the capacitance between the output terminal and the further metallic components would be particularly large. In conjunction with the high frequencies which occur due to the voltage switched at the output terminal of the power semiconductor, this would be a potential source of interference which might spread interferences into the surrounding systems. The additional shielding may allow for such interferences to be partially suppressed.

According to some further embodiments of the present invention, the second power semiconductor is arranged on an additional substrate for this purpose which comprises a conductor structure on a surface which is directly connected to the output terminal of the second power semiconductor, wherein the substrate is arranged between the second power semiconductor and the second supply voltage area. Using an additional substrate and/or an additional PCB makes it possible in a simple way, even when using two identical power semiconductors, to guide the supply voltage area below the power semiconductor without shorting its output. Furthermore, using a further substrate by which the output terminal of the second power semiconductor is contacted, the wanted functionality may be provided in a cost-effective and nevertheless flexible manner. In addition, the distance between the output terminal of the power semiconductor, which is particularly critical with regard to the generation of interferences, and the neighboring metallic structures may be increased by the additional substrate so that the capacitance which is unavoidably formed by the output terminal with the surrounding metallic components is thereby reduced as well. Reducing this parasitic capacitance may further contribute to minimize the interferences generated by the high switching frequencies. Any three-dimensional body is to be understood as a substrate in this sense which is electrically insulating in intrinsic terms; however, on which, at which or in which electrically conducting structures and/or conductive traces may be and/or are arranged.

In addition to the measures relating to the parasitic output capacitance of the power semiconductor, the electromagnetic compatibility may be further improved according to some embodiments of the present invention by implementing the electrical assembly in a symmetrical manner with regard to further features and/or circuit parts. To facilitate this, the first and the second supply voltage areas are implemented approximately identical with regard to the geometrical area according to some embodiments of the present invention. This means that the first supply voltage area extending within a plane and the second supply voltage area extending within a further plane comprise a difference in area of, for example, less than ten percent, preferably less than five percent, so that the interferences and/or switching currents induced in the supply voltage branches behave and/or spread symmetrically, something that may overall reduce the emission of electromagnetic interferences. That is, using a suitable board layout and/or a suitable layout of the electrical assembly may result in the emission of interferences being reduced further.

According to some further embodiments, the supply voltage areas extend within the same plane and are furthermore symmetrical with regard to an axis of symmetry located between these two areas. A completely symmetrical implementation of the supply voltage areas and/or the intermediate circuit may further improve the electromagnetic compatibility.

According to some further embodiments, the two supply voltage areas are coupled to one another by at least one capacitor so that possibly symmetrically induced currents do not compensate one another in part only in the far field, but that furthermore a at least partial compensation of the interference may take place at the place of generation. According to some embodiments, the emission of interfering electromagnetic waves may thereby be further reduced.

According to some embodiments of the present invention, Insulated Gate Bipolar Transistors (IGBTs) of the same type are used as power semiconductors in each case so that additional interferences caused by different component implementations and/or manufacturing methods may be avoided.

According to some further embodiments of the invention, the supply voltage areas are connected in a low-inductance manner, i.e., without comprising a high inductance which might result in interfering electromagnetic fields being emitted. For this purpose, the contactings of the first and the second supply voltage areas each are guided up to the edge of a housing as two-dimensional contacts in each case, where they may be contacted from the outside. An additional shielding effect for the power semiconductors and/or IGBTs used may possibly be achieved if the two-dimensional conductor structures used for contacting extend on both sides of the power semiconductors. That means that, according to some embodiments, the second supply voltage area on one side of the power semiconductor may, for example, be elongated up to the edge of the housing, and the first supply voltage area on the opposite side of the power semiconductor may be guided up to the edge of the housing so that the power semiconductors are enclosed by the two metallic areas, something that may result in a further shielding of the components relevant for emitting the interferences, particularly the output terminals of the power semiconductors.

According to some embodiments, a ceramic substrate is located on the side of the supply voltage areas which faces away from the power semiconductors on which the supply voltage areas are applied so that, on the one hand, the same may serve to transfer the electric power and, on the other hand, to couple a cooling system via the ceramic area and/or the ceramic, something that may be necessary for the continuous operation of the electrical assembly.

To facilitate a long-term stable operation, further embodiments of the present invention may, for example, comprise a metallic heat sink on the side of the ceramic substrate facing away from the power semiconductors to ensure a cooling and thus to enhance the longevity of the electrical assembly in a cost-effective manner and in an integrated design.

According to some further embodiments of the present invention, the electrical assembly comprises a further pair or two further pairs of identical power semiconductors which are connected to a second alternating voltage output and/or to a third alternating voltage output of the electrical assembly so that, by means of further embodiments of the present invention, two-phase or three-phase alternating currents, and/or in further embodiments alternating currents with any number of phases, may also be generated without significant interferences being spread into the on-board network and/or into the surrounding electric networks and/or radio networks.

Embodiments of the present invention will be described in more detail in the following with reference to the accompanying figures, in which.

Figure 1:
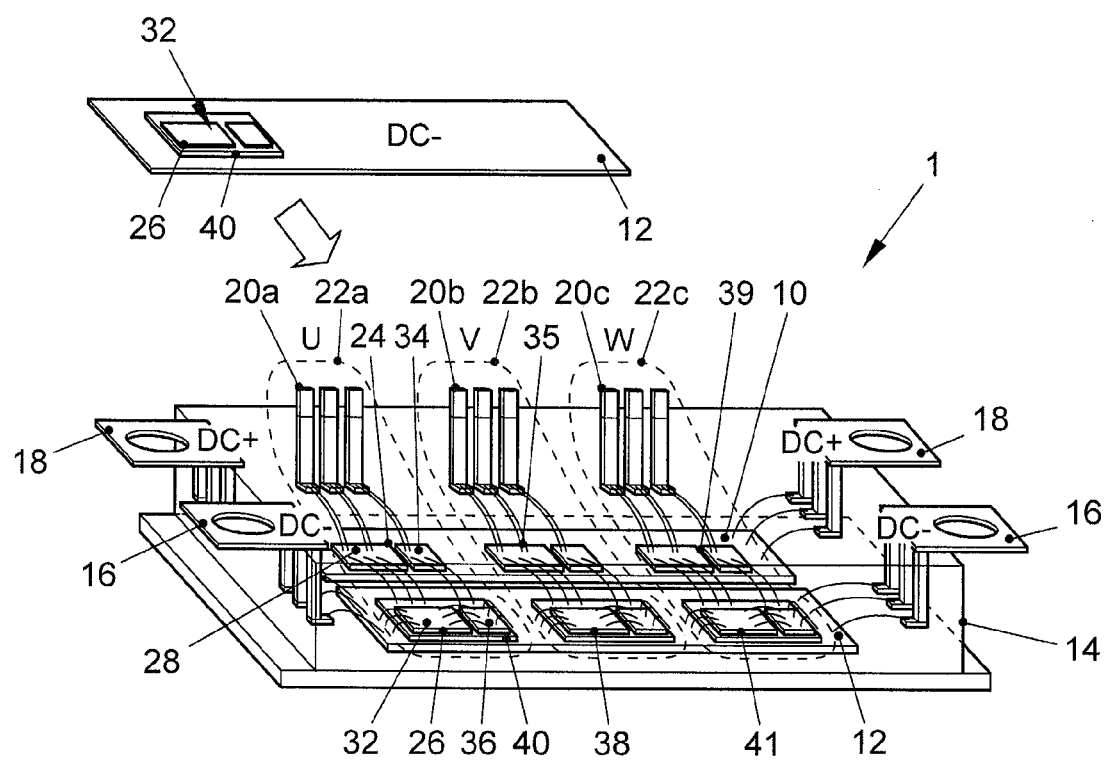
FIG. 1 shows an embodiment of an electrical assembly for converting a direct voltage into an alternating voltage.

Various example embodiments will now be described in more detail with reference to the accompanying drawings in which some embodiments are illustrated. In the figures, the thicknesses of lines, layers and/or regions may be exaggerated for clarity.

In the following description of the accompanying figures, which merely show some exemplary embodiments, like reference numbers may refer to like or comparable components. Furthermore, summarizing reference numbers may be used for components and objects which occur several times in an embodiment or in a drawing, but are described jointly with regard to one or several features. Components or objects which are described using like or summarizing reference numbers may be realized in the same way—however, if necessary, also be implemented differently—with regard to individual, several or all features, such as their dimensionings.

Even though embodiments may be modified and amended in various ways, embodiments in the figures are represented as examples and are described in detail herein. However, it is made clear that it is not intended to limit embodiments to the particular forms disclosed, but on the contrary, embodiments should cover any and all functional and/or structural modifications, equivalents, and alternatives falling within the scope of the invention. Like reference numbers refer to like or similar elements throughout the entire description of the figures.

It should be noted that, when an element is referred to as being "connected" or "coupled" to another element, it can be directly connected or coupled to the other element or intervening elements may be present. In contrast, when an element is referred to as being "directly connected" or "directly coupled" to another element, no intervening elements are present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to limit the embodiments. As used herein, the singular forms "a," "an" and "the" are intended to include the plural forms as well, unless the context clearly indicates otherwise. It is further made clear that the terms, e.g., "comprises," "comprising," "includes" and/or "including," as used herein, specify the presence of stated features, integers, steps, operations, elements and/or components, but do not preclude the presence or addition of one or more further features, integers, steps, operations, elements, components and/or groups thereof.

Unless defined otherwise, any and all terms (including technical and scientific terms) used herein have the same meaning as commonly understood by one of ordinary skill in the art to which embodiments belong. It is further made clear that terms, e.g., those defined in commonly used dictionaries, should be interpreted as having a meaning that is consistent with their meaning in the context of the relevant art and should not be interpreted in an idealized or overly formal sense unless expressly defined herein.

FIG. 1 shows an embodiment of an electrical assembly 1 for converting a direct voltage into an alternating voltage. The electrical assembly 1 comprises a first supply voltage area 10 for distributing a first DC supply voltage in the assembly and a second supply voltage area 12 for distributing a second DC supply voltage. In the example shown in FIG. 1, the configuration of the power semiconductors and the supply voltages used is selected such that the first supply voltage area 10 should be supplied from a positive supply voltage and the second supply voltage area 12 should be supplied from a negative supply voltage. To be able to contact the supply voltage areas from outside of a housing 14 enclosing the electrical assembly, the supply voltage areas 10 and 12 are connected to both sides of the housing 14 with supply voltage clamps 16 and 18 using bond wires in the embodiment shown in FIG. 1.

The electrical assembly shown in FIG. 1 serves to generate a three-phase alternating current with the phases of U, V and W which may each be tapped at an alternating voltage output 20a, 20b and 20c. As the wiring of the IGBTs used to generate the individual phases within the individual alternating voltage branches 22a, 22b and 22c which respectively generate the phases does not differ, apart from the control of the gate electrodes, which is not illustrated here for the sake of clarity, the electrical assembly and/or its set-up and functionality is hereinafter described using the first alternating voltage branch 22a only.

The same comprises a first power semiconductor 24 and/or a first IGBT and a second power semiconductor 26 and/or IGBT. The first power semiconductor 24 comprises an input terminal which points in the direction of the first supply voltage area 10 and is directly connected to the same. That is, the vertical power semiconductor 24 and/or the IGBT, which facilitates a vertical current flow through the semiconductor component, is, with its input terminal, directly connected to a metalization and/or conductive copper trace on the surface of the supply voltage area 10. An output terminal 28 pointing away from the supply voltage area 10 is connected to the alternating voltage output 20a using bond wires.

The output terminal of the second power semiconductor 26 is also connected to the alternating voltage output 20a using bond wires via the output terminal 28 of the first power semiconductor 24. However, the output terminal of the second power semiconductor 26 is here arranged on the side of the power semiconductor 26 facing the second supply voltage area 12. The input terminal 12 facing away from this area is connected to the second supply voltage area 12 using bond wires. That is, in the embodiments shown here, the input and/or output terminals of the vertical power semiconductors are, in part, located directly on the surface of conductive traces which are used to wire the components. In parallel to the respective power semiconductors, free-wheeling diodes 34 and 36 are principally wired in the usual way, however, their functioning is not described in this specification. Even though electric contacting is here mainly illustrated by using bond wires, it may be made in any other way between the elements conductively connected in each case, such as using isolated strands, rigid conductors or the like.

In order to improve the electromagnetic compatibility compared to conventional wirings and/or electrical assemblies for generating alternating voltages which are briefly described hereinafter, in case of both the first power semiconductor 24 and the second power semiconductor 26, the supply voltage area 10 and/or 12, which are respectively allocated to the same, also extends below the power semiconductors 24 and 26. Even though this may still be customary for reasons of contacting in case of the first power semiconductor 24, this is facilitated by an additional substrate 40 arranged between the second power semiconductor 26 and the second supply voltage area 12 for this purpose in the embodiment shown in FIG. 1. The output terminal of the second power semiconductor 26 is directly connected and/or attached by soldering to a metalization and/or a conductive trace on the surface of this substrate 40 so that it becomes possible due to the isolating substrate 40 on the surface of the second supply voltage area 12 that the same extends completely below the second power semiconductor 26 as well.

Regardless of whether or not it refers to a collector or an emitter of a power semiconductor and/or an IGBT, an output terminal herein shall be understood to be such terminal which is used to switch the voltage to the output and/or the alternating voltage output 20a using the power semiconductor. Accordingly, an input terminal of a power semiconductor as used herein shall be understood to be such terminal which is connected to the supply voltage in an electrically conducting manner.

When using identical IGBTs in the embodiment shown in FIG. 1, the input terminal of the second power semiconductor 26 would be the emitter of the same and the output terminal would be the collector of the second power semiconductor 26. In contrast, the collector of the first power semiconductor 24 would be the input terminal, and the emitter of the second power semiconductor 24 would be the output terminal of the same. Even though described herein using IGBTs as power semiconductors and/or power switches, other, particularly vertical, power-switching elements may also be used in other embodiments of the invention, such as field effect transistors (FETs), Power MOS FETs or the like.

Figure 2:
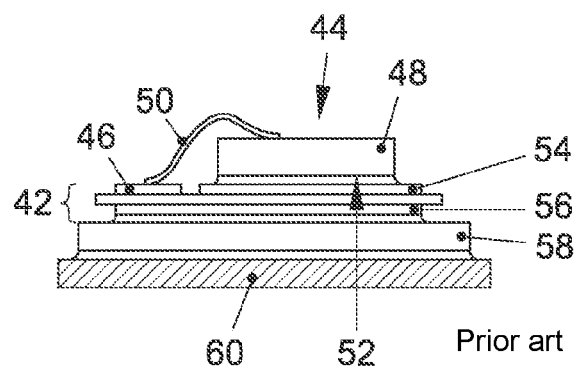
FIG. 2 shows a sectional view by the conventional arrangement in which a power semiconductor may be mounted alternatively in an assembly according to FIG. 1.

For comparison, FIG. 2 shows a conventional wiring and/or a conventional configuration for the second power semiconductor 26 in a sectional view. Conventionally, i.e., without the substrate 40, for the configuration illustrated in FIG. 1 a power semiconductor would be attached on a PCB 42, the input terminal 44 would, by a bond wire 50, be contacted to a conductive copper trace 46 which extends up to the power semiconductor 48. The output terminal 52 would directly be attached to another conductive trace 54 by soldering. A copper layer 56 is typically located on the backside of the PCB as well which is attached by soldering in a sufficient thermal coupling to a carrier 58 of the assembly on the backside of which a heat sink 60 is typically located again in order to dissipate the waste heat resulting during operation. However, due to the conventional arrangement of FIG. 2, the supply voltage area 46 does not extend up to below the output terminal 52 as this is the case according to the embodiments of the invention. Thus, the output terminal 52 forms a comparably high parasitic capacitance with the metallic heat sink amongst others. In this respect, the configuration shown in FIG. 2 is particularly unfavorable as the output terminal 52 switched at a high frequency is in close spatial proximity to the further metallic and/or conducting assemblies.

Figure 3:
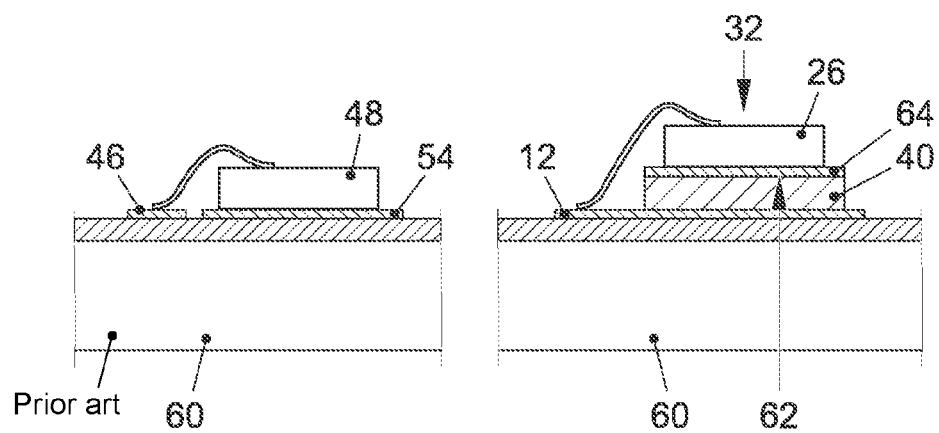
FIG. 3 shows a comparison between a conventional arrangement also illustrated in FIG. 2 and an arrangement according to an embodiment of the present invention.

In the left illustration, FIG. 3 shows the conventional configuration shown in FIG. 2 again in a schematic sectional view. On the right hand side of FIG. 3, this is compared to a simplified sectional view of the wiring and/or configuration of the second power semiconductor 26 used according to the embodiments of the invention which is arranged on an additional substrate 40 so that its output terminal 62 may directly be attached by soldering to a conductor structure 64 on the surface of the substrate 40. This will allow the second supply voltage area 12 to extend up to below and/or fully below the second power semiconductor 26, something that, on the one hand, results in the output terminal 62 being shielded, for example with regard to the heat sink 60. On the other hand, the larger distance to the same reduces the parasitic capacitance, both of which may result in a considerable reduction in interferences and/or an improvement of the EMC of electrical assemblies of the invention.

Figure 4:
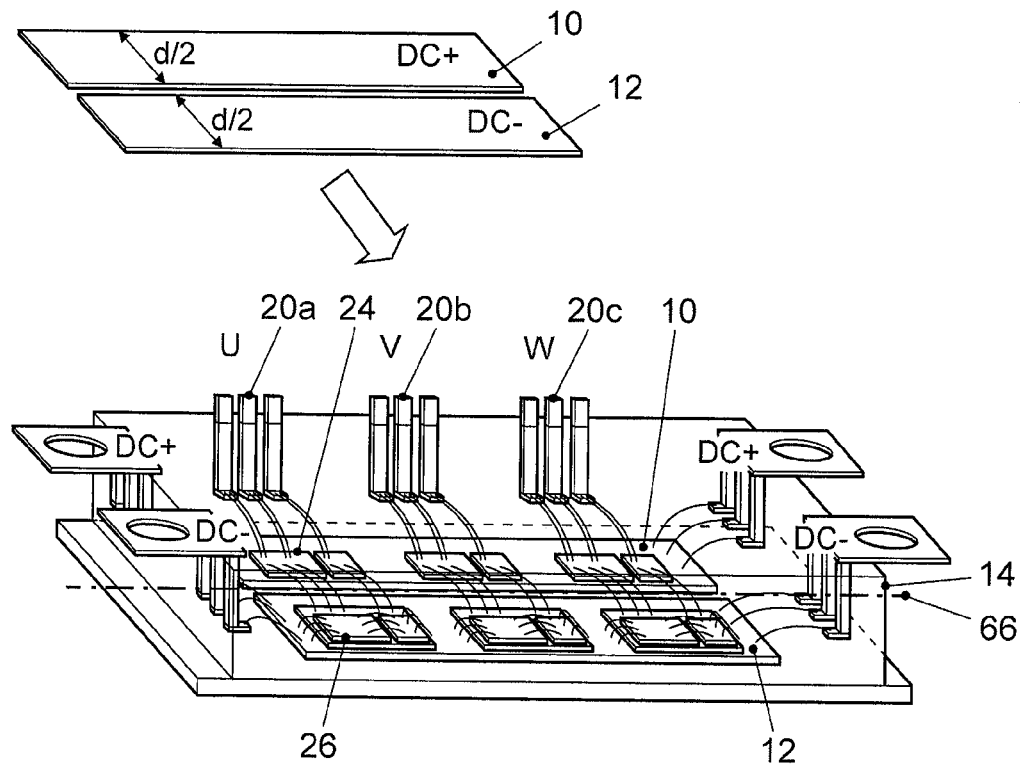
FIG. 4 shows a further embodiment of an electrical assembly.

FIG. 4 shows a further embodiment of the present invention which, regarding a wide range of features, is based on the embodiment described using FIG. 1 so that merely the differences are addressed below.

With regard to the embodiment shown in FIG. 4, the EMC is further improved by executing the intermediate circuit symmetrically. To achieve this, the two supply voltage areas 10 and 12 extending in the same plane are on the one hand identical with regard to their geometrical area and on the other hand symmetrical with regard to a common axis of symmetry 66, each of which by itself may already improve the EMC. The EMC of the embodiment shown in FIG. 1 may be further improved by the configuration of the fully symmetrical implementation and/or intermediate circuit shown in FIG. 4.

Figure 5:
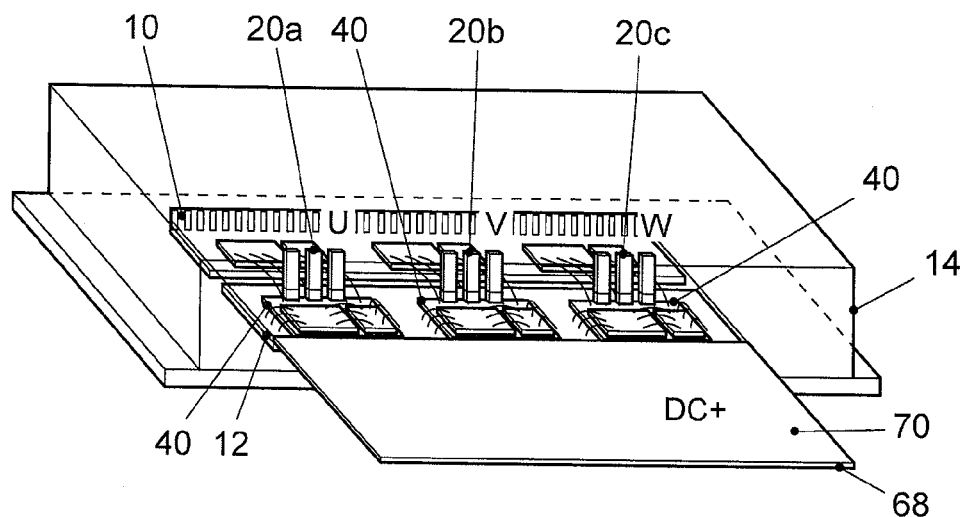
FIG. 5 shows a further embodiment of an electrical assembly.

FIG. 5 shows a further embodiment of the invention which, concerning its key elements, is based on the embodiments previously discussed using FIGS. 1 and 3 so that, in this case, too, merely the differences with regard to these embodiments will be briefly discussed. In the embodiment shown in FIG. 5, the intermediate circuit is connected outwardly in a low-inductance manner. That means that the contactings required to connect the first and second supply voltage areas 10 and 12 to outside of the housing 14 comprise a low inductance. In the present case, this is achieved by the contactings being guided outwardly in the form of metallic areas for which, for example,—as shown in FIG. 5—the second supply voltage area 12 is elongated to outside of the housing 14 with a two-dimensional second contacting 68. Furthermore, in the embodiment shown in FIG. 5, the first contacting 70 also extends two-dimensionally up to the edge of the housing 14 in order to be able to there be connected to the supply voltage sources. In the embodiment shown in FIG. 5, the power semiconductors are furthermore enclosed on both sides by the electrically conducting contactings 68 and 70 and/or the supply voltage areas 10 and 12 so that this type of connection may have a further shielding effect in addition to the prevention of unwanted inductances in the intermediate circuit.

Furthermore, in the embodiment shown in FIG. 5, the connection of the alternating voltage outputs 20a to 20c is also implemented in a low-inductance manner, i.e., the use of bond wires is waived by attaching the alternating voltage outputs 20a to 20c by soldering directly to the additional substrates 40.

Figure 6:
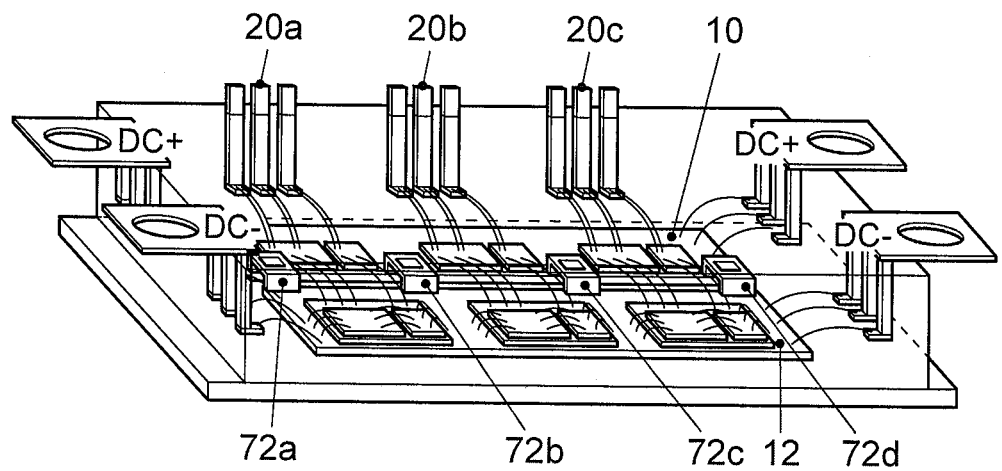
FIG. 6 shows a further embodiment of an electrical assembly.

FIG. 6 shows a further embodiment of the present invention in which a further improvement of the EMC of the electrical assembly 1 may be achieved by using multiple capacitors 72a to 72d which on the one hand are connected to the first supply voltage area 10 and on the other hand to the second supply voltage area 12. In principal, it is already advantageous if the first supply voltage area (10) and the second supply voltage area (12) are coupled to one another by at least one capacitor. According to further embodiments, the supply voltage areas may also be connected via multiple capacitors. According to some further embodiments, the two supply voltage areas may also be connected to one another using multiple capacitors, also of a different type and/or different capacitance, something that may result in interferences being suppressed across an expanded frequency range.

According to the previously described embodiments of the present invention, embodiments of electrical assemblies of the invention may be employed in a motor vehicle, particularly in high voltage parts, for example, when controlling electric drive motors or the like.

Figure 7:
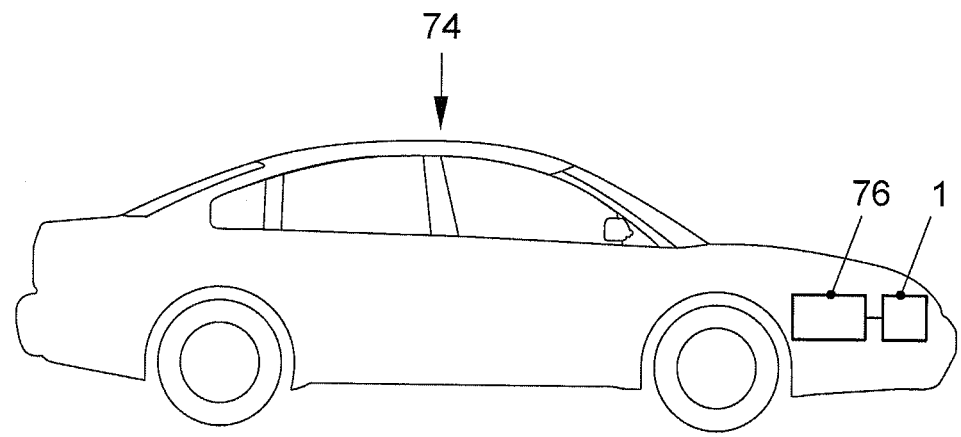
FIG. 7 shows a schematic representation of the use of an electrical assembly in a motor vehicle.

For the sake of completeness, FIG. 7 shows a schematic illustration of the use of an electrical assembly 1 in a motor vehicle 74. The motor vehicle 74 comprises at least one electric drive motor 76 which is controlled by an electrical assembly 1 connected to the drive motor 76 according to any of the embodiments of the invention.

Even though the preceding embodiments were mainly described in the context of motor vehicle applications, further embodiments of electrical assemblies of the invention may also be used in other application scenarios, such as in stationary facilities and therein, for example, in industrial converters of solar systems, wind turbines, hydroelectric plants or the like.

The features disclosed in the preceding description, the subsequent claims and the accompanying figures may be of importance and be implemented, both individually and in any combination, for the realization of an embodiment in their various implementations.

The embodiments described above merely illustrate the principles of the present invention. It will be understood that modifications and variations of the arrangements and details described herein are clear to other persons skilled in the art. Therefore, it is intended that the invention be merely limited by the scope of the following patent claims and not by the specific details which were presented on the basis of the description and the explanation of the embodiments.

The invention claimed is:

1. An electrical assembly for converting a direct voltage into an alternating voltage, comprising:
    a first supply voltage area for distributing a first DC supply voltage;
    a second supply voltage area for distributing a second DC supply voltage;
    at least one first power semiconductor having an input terminal connected to the first supply voltage area and an output terminal connected to an alternating voltage output of the assembly;
    at least one second power semiconductor having an input terminal connected to the second supply voltage area and an output terminal connected to the alternating voltage output of the assembly, wherein
    the first supply voltage area extends on the side of the first power semiconductor facing the input voltage terminal of the first power semiconductor,
    the second supply voltage area extends on the side of the second power semiconductor facing away from the input voltage terminal of the second power semiconductor; and wherein the second power semiconductor is arranged on an additional substrate which comprises a conductor structure at a surface of the substrate which is connected to the output terminal of the second power semiconductor, wherein the substrate is arranged between the second power semiconductor and the second supply voltage area.

2. The electrical assembly according to claim 1, characterized in that the first supply voltage area and the second supply voltage area each extend two-dimensionally within one plane, wherein a first surface area of the first supply voltage area differs by less than 10% from a second surface area of the second supply voltage area.

3. The electrical assembly according to claim 1, characterized in that the first supply voltage area and the second supply voltage area extend within the same plane.

4. The electrical assembly according to claim 1, characterized in that the first supply voltage area and the second supply voltage area are arranged symmetrically to one another with regard to an axis of symmetry.

5. The electrical assembly according to claim 1, characterized in that the first supply voltage area and the second supply voltage area are coupled to one another by at least one capacitor.

6. The electrical assembly according to claim 1, characterized in that the first power semiconductor and the second power semiconductor each are an Insulated Gate Bipolar Transistor of the same type.

7. The electrical assembly according to claim 1, characterized in that the assembly is at least in part surrounded by a housing, wherein a second contacting of the second supply voltage area extends in an elongation of the area of the second supply voltage area up to the edge of the housing, and wherein a first contacting of the first supply voltage area, as an area in parallel to the second contacting, extends up to the edge of the housing, wherein the first contacting and the second contacting are arranged on opposite sides of the first power semiconductor and the second power semiconductor.

8. The electrical assembly according to claim 1, characterized in that the output terminal of the first power semiconductor is arranged on the side of the first power semiconductor facing away from the first supply voltage area, wherein the output terminal of the second power semiconductor is arranged on the side of the second power semiconductor facing the second supply voltage area.

9. The electrical assembly according to claim 8, characterized in that a metallic heat sink is located on the side of the ceramic substrate facing away from the first power semiconductor and the second power semiconductor.

10. The electrical assembly according to claim 9, characterized in that the assembly further comprises a fifth power semiconductor having an input terminal connected to the first supply voltage area and an output terminal connected to a third alternating voltage output of the circuit; and
    a sixth power semiconductor having an input terminal connected to the second supply voltage area and an output terminal connected to the third alternating voltage output of the assembly, wherein the second supply voltage area extends on the side of the sixth power semiconductor facing away from the input voltage terminal of the sixth power semiconductor, and that the first supply voltage area extends on the side of the fifth power semiconductor facing the input voltage terminal of the fifth power semiconductor.

11. The electrical assembly according to claim 1, characterized in that a ceramic substrate is located on the side of the first supply voltage area and the second supply voltage area which faces away from the first power semiconductor and the second power semiconductor.

12. The electrical assembly according to claim 1, characterized in that the assembly further comprises a third power semiconductor having an input terminal connected to the first supply voltage area and an output terminal connected to the second alternating voltage output of the assembly; and
    a fourth power semiconductor having an input terminal connected to the second supply voltage area and an output terminal connected to the second alternating voltage output of the assembly, wherein the second supply voltage area extends on the side of the fourth power semiconductor facing away from the input voltage terminal of the fourth power semiconductor, and that the first supply voltage area extends on the side of the third power semiconductor facing the input voltage terminal of the third power semiconductor.

13. A motor vehicle having at least one electric drive motor and having an electrical assembly according to claim 1 connected to the drive motor.

* * * * *